(12) United States Patent
Hsueh

(10) Patent No.: US 10,910,221 B2
(45) Date of Patent: Feb. 2, 2021

(54) SEMICONDUCTOR DEVICE STRUCTURE WITH A FINE PATTERN AND METHOD FOR FORMING THE SAME

(71) Applicant: NANYA TECHNOLOGY CORPORATION, New Taipei (TW)

(72) Inventor: Yu-Han Hsueh, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/456,921

(22) Filed: Jun. 28, 2019

(65) Prior Publication Data

US 2020/0411319 A1    Dec. 31, 2020

(51) Int. Cl.
*H01L 21/033* (2006.01)
*H01L 21/311* (2006.01)
*H01L 23/00* (2006.01)

(52) U.S. Cl.
CPC ...... *H01L 21/0338* (2013.01); *H01L 21/0337* (2013.01); *H01L 21/31144* (2013.01); *H01L 23/564* (2013.01)

(58) Field of Classification Search
CPC ............. H01L 21/0338; H01L 21/0337; H01L 23/564; H01L 21/31144
USPC .................................................. 438/702, 696
See application file for complete search history.

(56) References Cited

U.S. PATENT DOCUMENTS 8,969,206 B1 *  3/2015  Sel ...................... H01L 21/0337
                                                            438/696
2016/0149054 A1  5/2016  Basu et al.

OTHER PUBLICATIONS

Office Action dated Jun. 30, 2020 in TW Application No. 108127194.

* cited by examiner

*Primary Examiner* — Caleen O Sullivan
(74) *Attorney, Agent, or Firm* — Muncy, Geissler, Olds & Lowe, P.C.

(57) ABSTRACT

The present application discloses a semiconductor device structure and a method for forming the same. The method includes forming a pillar over a substrate, forming a first ring structure over a sidewall of the pillar, removing the pillar to form a first opening surrounded by the first ring structure, forming a second ring structure in the first opening, forming a third ring structure surrounding the first ring structure after the first opening is formed, and removing the first ring structure to form a gap between the second and third ring structures. A semiconductor device structure includes a dielectric layer over a substrate, a first ring structure over the dielectric layer, and a second ring structure over the dielectric layer and surrounding the first ring structure, wherein the first and the second ring structures have a first common center.

12 Claims, 8 Drawing Sheets

SEMICONDUCTOR DEVICE STRUCTURE WITH A FINE PATTERN AND METHOD FOR FORMING THE SAME

TECHNICAL FIELD

The present disclosure relates to a semiconductor device structure and a method for forming the same, and more particularly, to a semiconductor device structure with a fine pattern and a method for forming the same.

DISCUSSION OF THE BACKGROUND

As semiconductor device structures become smaller and more highly integrated, a number of technologies for fabricating fine patterns for semiconductor device structures have been developed. Particularly, a photolithography process is typically used to fabricate electronic and optoelectronic devices on a substrate, and photoresist patterns prepared by the photolithography process are used as masks in etching or ion implantation processes. As the required pitch size and critical dimension (CD) continue to shrink, the fineness of the photoresist patterns becomes a very important factor in the degree of integration. However, photolithographic processes for fabricating semiconductor features present a limitation to continued increases in resolution of the exposure apparatus.

Although existing semiconductor device structures with fine patterns and methods for manufacturing the same have been adequate for their intended purposes, they have not been entirely satisfactory in all respects. Therefore, at the present time, there are still some problems to be overcome in regards to the technologies of forming semiconductor device structures with fine patterns by photolithographyprocess.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for forming a semiconductor device structure is provided. The method includes forming a pillar over a substrate, and forming a first ring structure over a sidewall of the pillar. The method also includes removing the pillar to form a first opening surrounded by the first ring structure, and forming a second ring structure in the first opening. The method further includes forming a third ring structure surrounding the first ring structure after the first opening is formed, and removing the first ring structure to form a gap between the second ring structure and the third ring structure.

In some embodiments, the first ring structure is in direct contact with the second ring structure, and a width of the first ring structure is substantially the same as a width of the second ring structure.

In some embodiments, the first ring structure is in direct contact with the third ring structure, the second ring structure and the third ring structure are simultaneously formed, and a width of the second ring structure is substantially the same as a width of the third ring structure.

In some embodiments, a width of the pillar is greater than about three times a width of the first ring structure.

In some embodiments, the method further comprises: forming a dielectric layer over a top surface of the substrate and a top surface of the first ring structure before the second ring structure and the third ring structure are formed, wherein a top surface of the dielectric layer is higher than top surfaces of the second ring structure and the third ring structure before the first ring structure is removed.

In some embodiments, the second ring structure and the third ring structure are formed over the dielectric layer, and a material of the dielectric layer is different from a material of the second ring structure and a material of the third ring structure.

In some embodiments, a second opening is formed in the first opening after the second ring structure is formed, the second opening is surrounded by the second ring structure, and a width of the first ring structure is substantially the same as a width of the second opening.

In another embodiment of the present disclosure, a method for forming a semiconductor device structure is provided. The method includes forming a first pillar over a substrate, and forming a first ring structure surrounding the first pillar. A width of the first pillar is greater than a width of the first ring structure. The method also includes removing the first pillar after the first ring structure is formed, and forming a dielectric layer over a top surface of the substrate after the first pillar is removed. The method further includes forming a second ring structure and a third ring structure over the dielectric layer. The second ring structure is surrounded by the first ring structure, and the second ring structure is surrounded by the third ring structure. In addition, the method includes removing the first ring structure and a portion of the dielectric layer left uncovered by the second ring structure and the third ring structure.

In some embodiments, a portion of the dielectric layer is formed over the first ring structure, and a top surface of the portion of the dielectric layer is higher than a top surface of the second ring structure and a top surface of the third ring structure.

In some embodiments, the second ring structure is in direct contact with an inner sidewall of the first ring structure, and the third ring structure is in direct contact with an outer sidewall of the first ring structure.

In some embodiments, the second ring structure and the third ring structure are separated by substantially the same distance.

In some embodiments, bottom surfaces of the second ring structure and the third ring structure are higher than a bottom surface of the first ring structure.

In some embodiments, the method further comprises: forming a second pillar over the substrate; forming a fourth ring structure surrounding the second pillar; removing the second pillar; and forming a fifth ring structure lining an inner wall of the fourth ring structure and a sixth ring structure surrounding the fourth ring structure, wherein a distance between the third ring structure and the sixth ring structure is substantially the same as a width of the first ring structure and a width of the third ring structure.

In one embodiment of the present disclosure, a semiconductor device structure is provided. The semiconductor device structure includes a substrate, and a dielectric layer disposed over the substrate. The semiconductor device structure also includes a first ring structure disposed over the dielectric layer, and a second ring structure disposed over the dielectric layer and surrounding the first ring structure. The first ring structure and the second ring structure have a first common center. The first opening surrounded by the first ring structure has a width in a cross-sectional view, and the width is substantially the same as a distance between the first ring structure and the second ring structure in the cross-sectional view.

In some embodiments, the width of the first opening is substantially the same as a width of the first ring structure in the cross-sectional view.

In some embodiments, the width of the first ring structure is substantially the same as a width of the second ring structure in the cross-sectional view.

In some embodiments, a top surface of the substrate is exposed by the first opening.

In some embodiments, the dielectric layer is made of a first material, the first ring structure and the second ring structure are made of a second material, and the first material is different from the second material.

In some embodiments, the first ring structure and the second ring structure have similar shapes in a top view, and the first opening is circular or rectangular with rounded corners in the top view.

In some embodiments, the semiconductor device structure further comprises: a third ring structure disposed over the dielectric layer; and a fourth ring structure disposed over the dielectric layer and surrounding the third ring structure, wherein the third ring structure and the fourth ring structure have a second common center, and wherein a distance between the fourth ring structure and the second ring structure is substantially the same as the distance between the first ring structure and the second ring structure in the cross-sectional view.

Methods for forming a semiconductor device structure are provided in accordance with some embodiments of the disclosure. The method for forming the semiconductor device structure may include forming a first ring structure over a sidewall of a pillar, removing the pillar to form a first opening, forming a second ring structure in the first opening, forming a third ring structure surrounding the first ring structure, and removing the first ring structure to form a gap between the second ring structure and the third ring structure. As a result, the second ring structure is surrounded by the third ring structure, and the second ring structure is separated from the third ring structure by the gap. Therefore, the semiconductor device structure having a finer pattern over the substrate can be obtained.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
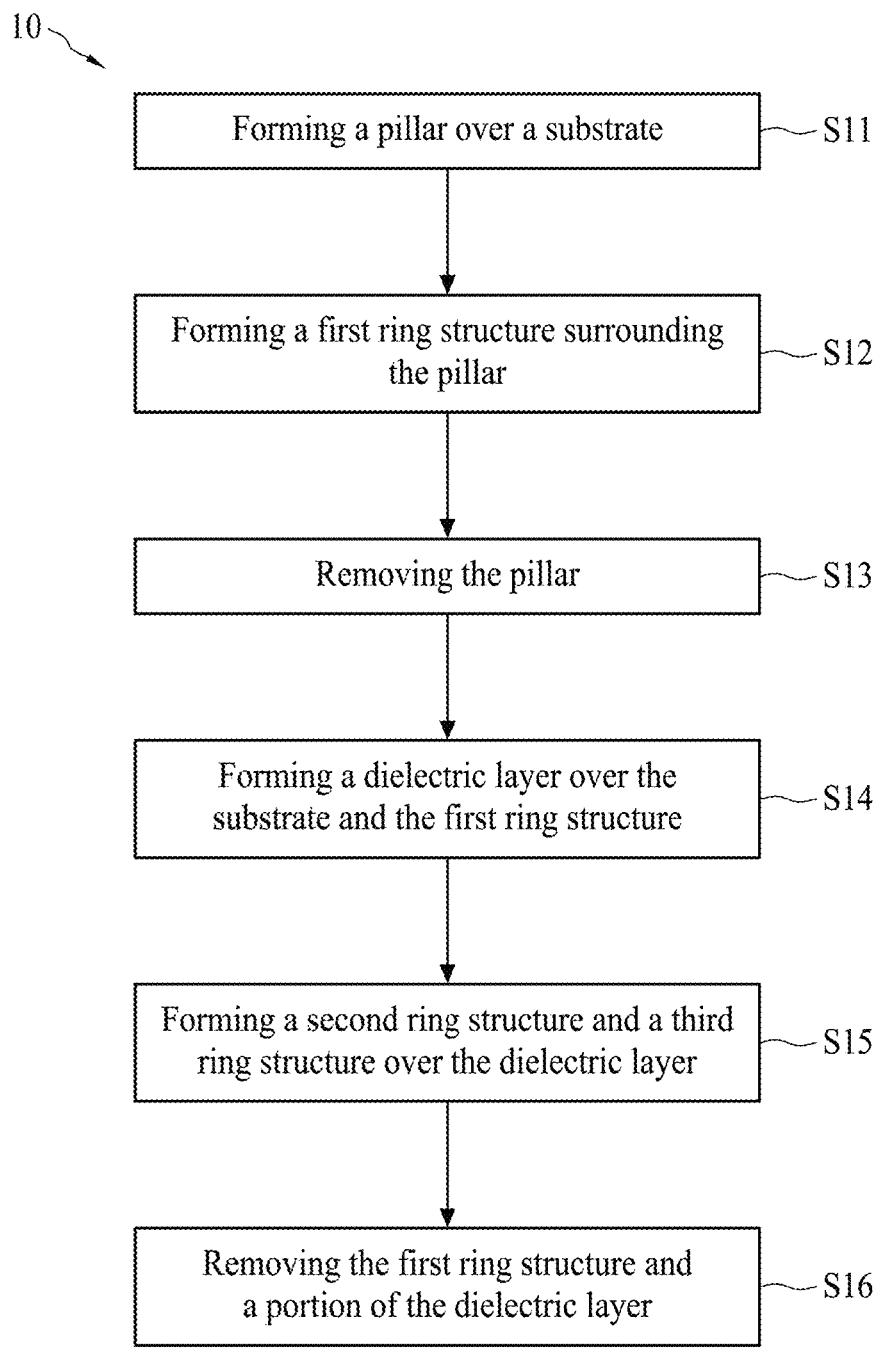
FIG. 1 is a flow diagram illustrating a method of forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for forming a semiconductor device structure, in accordance with some embodiments. The method 10 includes steps S11, S12, S13, S14, S15, and S16.

The steps S11 to S16 of FIG. 1 are first introduced briefly and then elaborated in connection with FIGS. 2 to 14. At step S11, a pillar is formed over a substrate. In some embodiments, more than one pillar is formed over the substrate, and each pair of the pillars are separated by a distance. At step S2, a first ring structure is formed surrounding the pillar. In some embodiments, the first ring structure is in direct contact with the pillar, and sidewalls of the pillar are entirely surrounded by the first ring structure. At step S13, the pillar is removed. In some embodiments, the pillar is removed to form an opening entirely surrounded by the first ring structure.

Still referring to FIG. 1, at step S14, a dielectric layer is formed over the substrate and the first ring structure. In some embodiments, a top surface of the substrate and a top surface of the first ring structure are covered by the dielectric layer. At step S15, a second ring structure and a third ring structure are formed over the dielectric layer. In some embodiments, the second ring structure is entirely surrounded by the first ring structure, and the first ring structure is entirely surrounded by the third ring structure. At step S16, the first ring structure and a portion of the dielectric layer are removed. In some embodiments, a portion of the dielectric layer not covered by the second ring structure or the third ring structure is removed.

Figure 2:
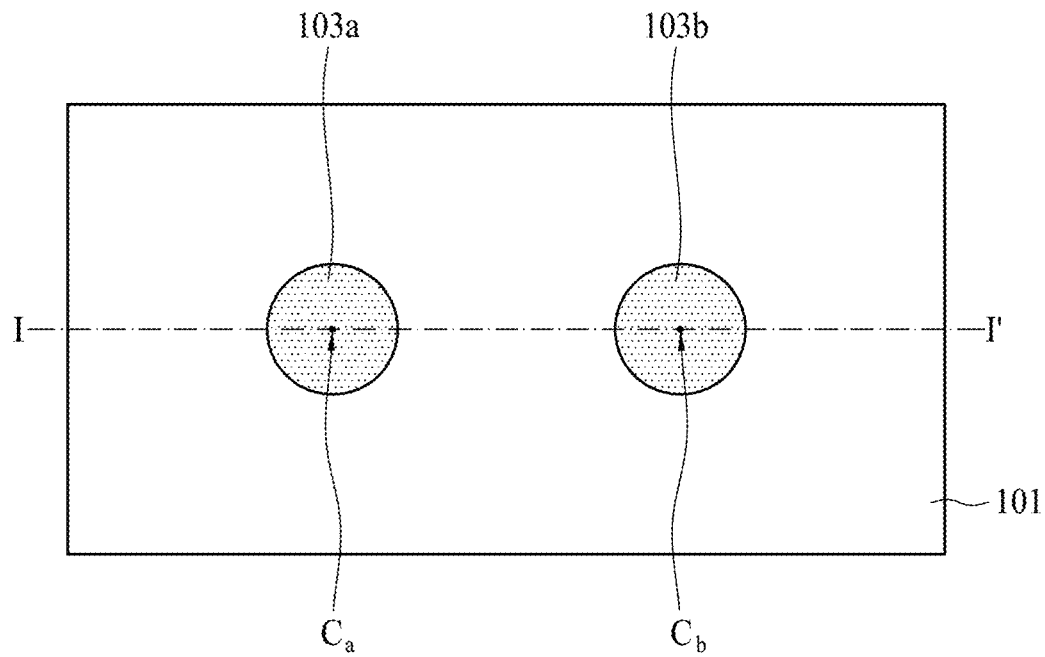
FIG. 2 is a top view illustrating an intermediate stage of forming a semiconductor device structure, in accordance with some embodiments.
Figure 3:
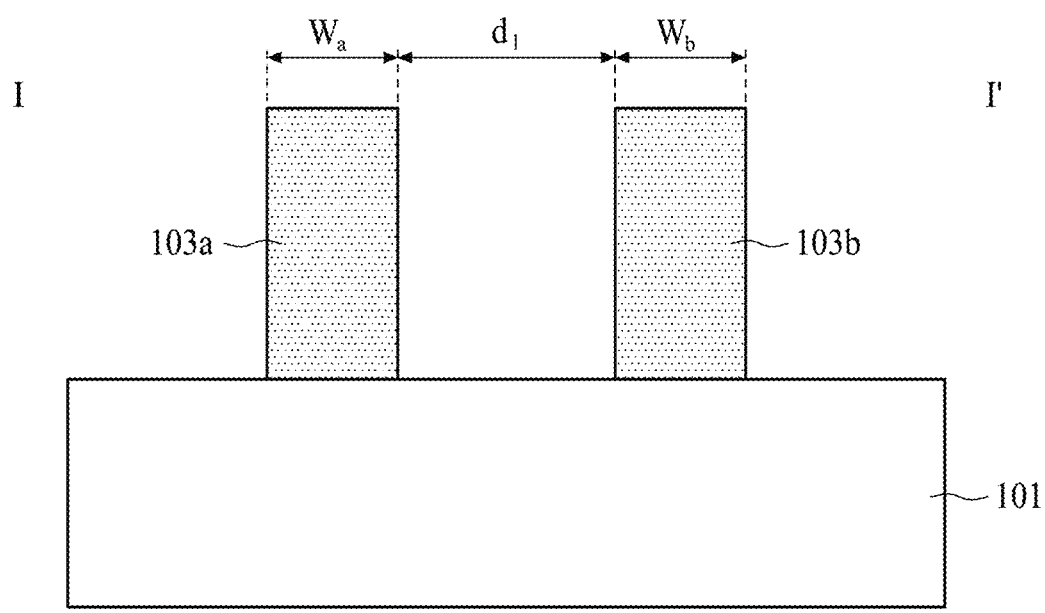
FIG. 3 is a cross-sectional view illustrating an intermediate stage of forming a semiconductor device structure, taken along a sectional line I-I' in FIG. 2, in accordance with some embodiments.
Figure 12:
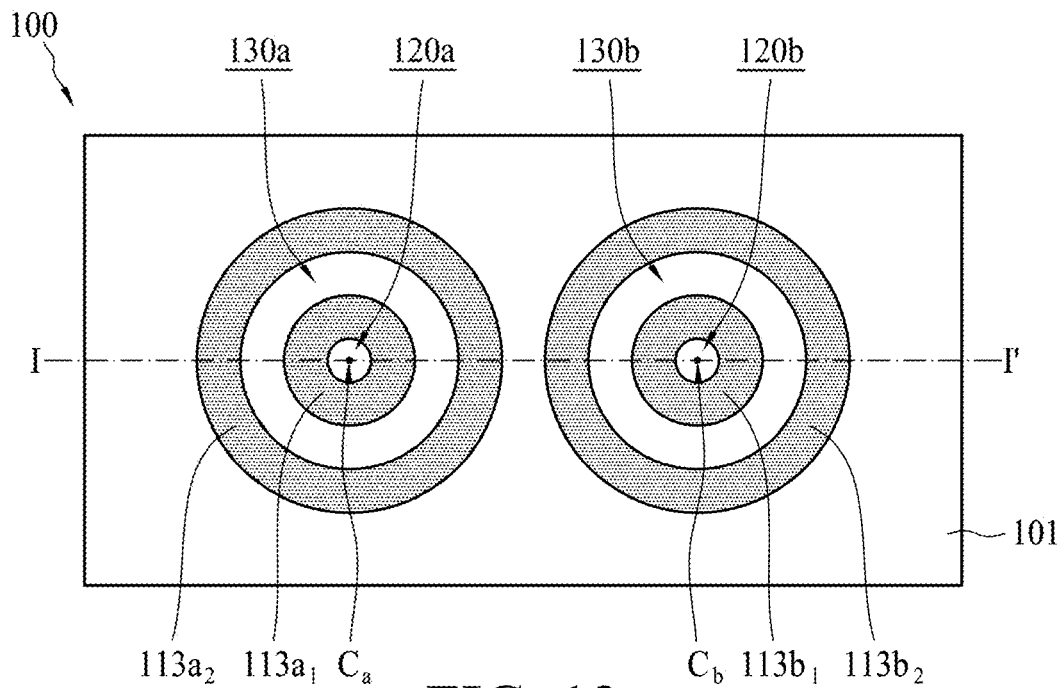
FIG. 12 is a top view illustrating a semiconductor device structure, in accordance with some embodiments.
Figure 13:
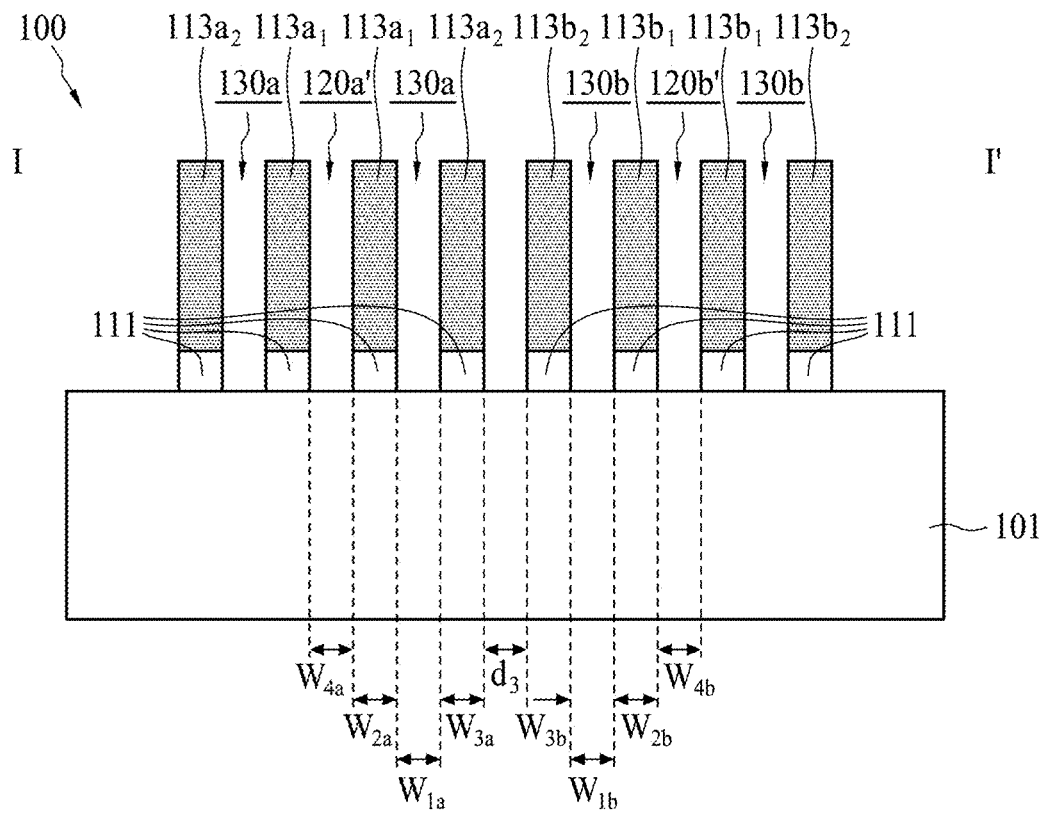
FIG. 13 is a cross-sectional view illustrating a semiconductor device structure, taken along a sectional line I-I' in FIG. 12, in accordance with some embodiments.

FIG. 2 is a top view illustrating an intermediate stage of forming a semiconductor device structure 100 in FIGS. 12 and 13, in accordance with some embodiments. FIG. 3 is a cross-sectional view illustrating an intermediate stage of forming the semiconductor device structure 100, taken along a sectional line I-I' in FIG. 2, in accordance with some embodiments.

As shown in FIGS. 2 and 3, pillars 103a and 103b are formed over a substrate 101. In some embodiments, the pillars 103a and 103b are circular in the top view of FIG. 2, the pillar 103a has a center $C_a$, and the pillar 103b has a center $C_b$. The cross-sectional view of FIG. 3 is along the sectional line I-I' of FIG. 2, and the sectional line I-I' passes through the centers $C_a$ and $C_b$. Moreover, the pillar 103a has a width $W_a$, the pillar 103b has a width $W_b$, and the pillar 103a and the pillar 103b are separated by a distance $d_1$, as shown in FIG. 3 in accordance with some embodiments.

In some embodiments, the substrate 101 is made of silicon. Alternatively, the substrate 101 may include other elementary semiconductor materials such as germanium (Ge). In some embodiments, the substrate 101 is made of a compound semiconductor such as silicon carbide, gallium nitride, gallium arsenic, indium arsenide, or indium phosphide. In some embodiments, the substrate 101 is made of an alloy semiconductor such as silicon germanium, silicon germanium carbide, gallium arsenic phosphide, or gallium indium phosphide. In some embodiments, the substrate 101 includes a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or by other suitable methods. In some embodiments, the substrate 101 includes various material layers (e.g., dielectric layers, semiconductor layers, and/or conductive layers) configured to form integrated circuit (IC) features (e.g., doped regions/features, isolation features, gate features, source/drain features (including epitaxial source/drain features), interconnect features, other features, or combinations thereof).

Moreover, the pillars 103a and 103b are made of dielectric materials, in accordance with some embodiments. In some embodiments, the pillars 103a and 103b include silicon oxide, silicon nitride, silicon carbide, silicon oxynitride, silicon oxycarbide (SiOC), silicon carbonitride (SiCN), silicon oxide carbonitride (SiOCN), another applicable material, or a combination thereof.

In addition, the pillars 103a and 103b are formed by a deposition process and a patterning process. For example, a material layer (not shown) may be deposited over the substrate 101, and the material layer may be patterned to form pillars 103a and 103b over the substrate 101. The deposition process may include a chemical vapor deposition (CVD) process, a physical vapor deposition (PVD) process, an atomic layer deposition (ALD) process, a spin-on process, another applicable process, or a combination thereof.

In some embodiments, the patterning process includes a photolithography process and a subsequent etching process. The photolithography process may form photoresist patterns (not shown) on a top surface of the material layer. The photolithography process may include photoresist coating (e.g., spin-on coating), soft baking, mask aligning, exposure, post-exposure baking, developing the photoresist, rinsing and drying (e.g., hard baking). In some embodiments, the etching process is a dry etching process, a wet etching process, or a combination thereof.

It should be noted that the width $W_a$ is substantially the same as the width $W_b$, and the proportion of the width $W_a$ to the distance $d_1$ is approximately three to five, in accordance with some embodiments. Within the context of this disclosure, the word "substantially" means preferably at least 90%, more preferably 95%, even more preferably 98%, and most preferably 99%. In addition, although the pillars 103a and 103b are circular in the top view of FIG. 2, the scope of the disclosure is not intended to be limiting. For example, in other embodiments, the pillars 103a and 103b may have other shapes in the top view.

Figure 4:
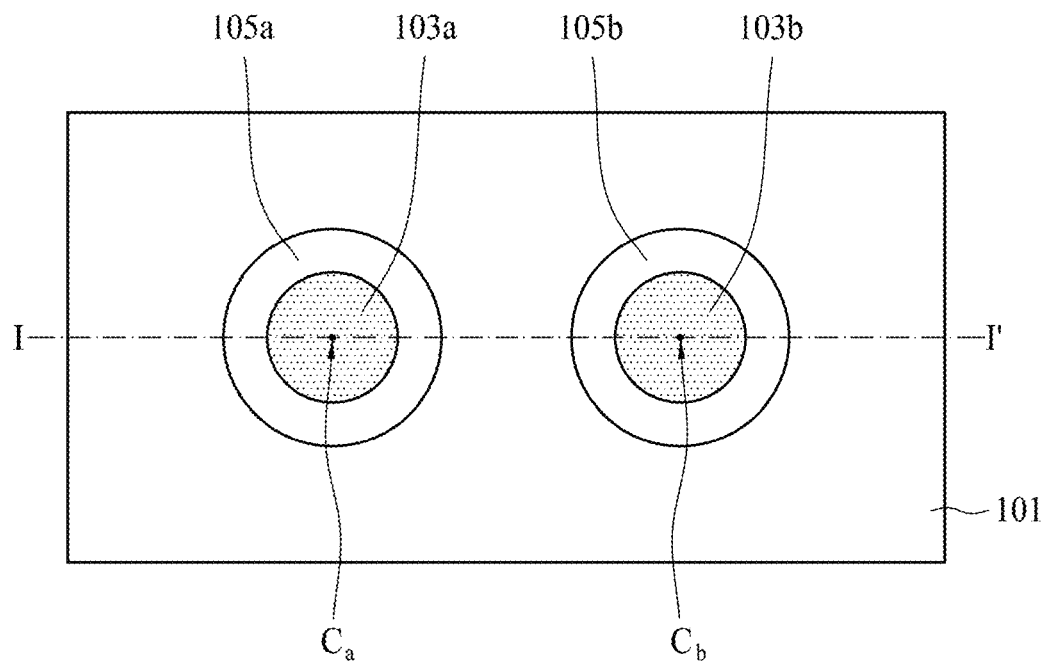
FIG. 4 is a top view illustrating an intermediate stage of forming a semiconductor device structure, in accordance with some embodiments.
Figure 5:
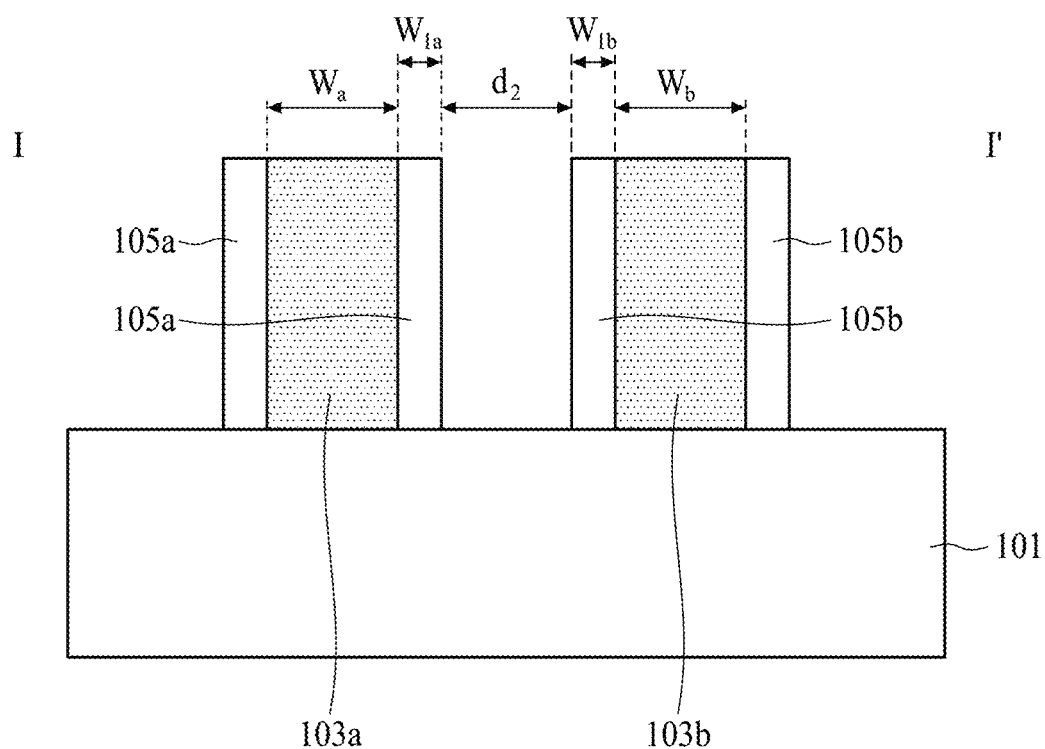
FIG. 5 is a cross-sectional view illustrating an intermediate stage of forming a semiconductor device structure, taken along a sectional line I-I' in FIG. 4, in accordance with some embodiments.

FIG. 4 is a top view illustrating an intermediate stage of forming the semiconductor device structure 100 in FIGS. 12 and 13, in accordance with some embodiments. FIG. 5 is a cross-sectional view illustrating an intermediate stage of forming the semiconductor device structure 100, taken along a sectional line I-I' in FIG. 4, in accordance with some embodiments.

As shown in FIGS. 4 and 5, first ring structures 105a and 105b are formed surrounding the pillars 103a and 103b. More specifically, sidewalls of the pillar 103a are entirely surrounded and in direct contact with the first ring structure 105a, and sidewalls of the pillar 103b are entirely surrounded and in direct contact with the first ring structure 105b, in accordance with some embodiments. In other words, sidewalls of the pillar 103a have no portion not covered by the first ring structure 105a, and sidewalls of the pillar 103a have no portion not covered by the first ring structure 105b.

Some materials and processes used to form the first ring structures 105a and 105b are similar to those used to form the pillars 103a and 103b and are not repeated herein. However, it should be noted that the materials of the pillars 103a and 103b are different from the materials of the first ring structures 105a and 105b.

The first ring structure 105a has a width $W_{1a}$, the first ring structure 105b has a width $W_{1b}$, and the first ring structure 105a and the first ring structure 105b are separated a distance $d_2$, as shown in FIG. 5 in accordance with some embodiments. In some embodiments, the width $W_{1a}$ is substantially the same as the width $W_{1b}$, the distance $d_2$ is substantially the same as the width $W_a$, and the proportion of the width $W_{1a}$ to the distance $d_2$ is approximately one to three, in accordance with some embodiments.

Figure 6:
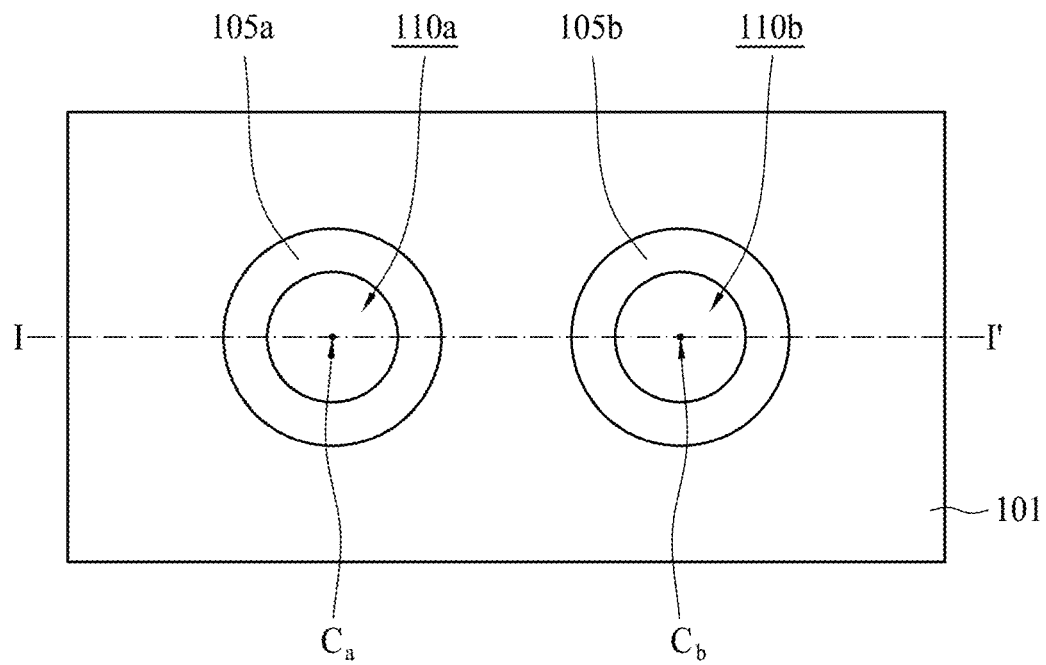
FIG. 6 is a top view illustrating an intermediate stage of forming a semiconductor device structure, in accordance with some embodiments.
Figure 7:
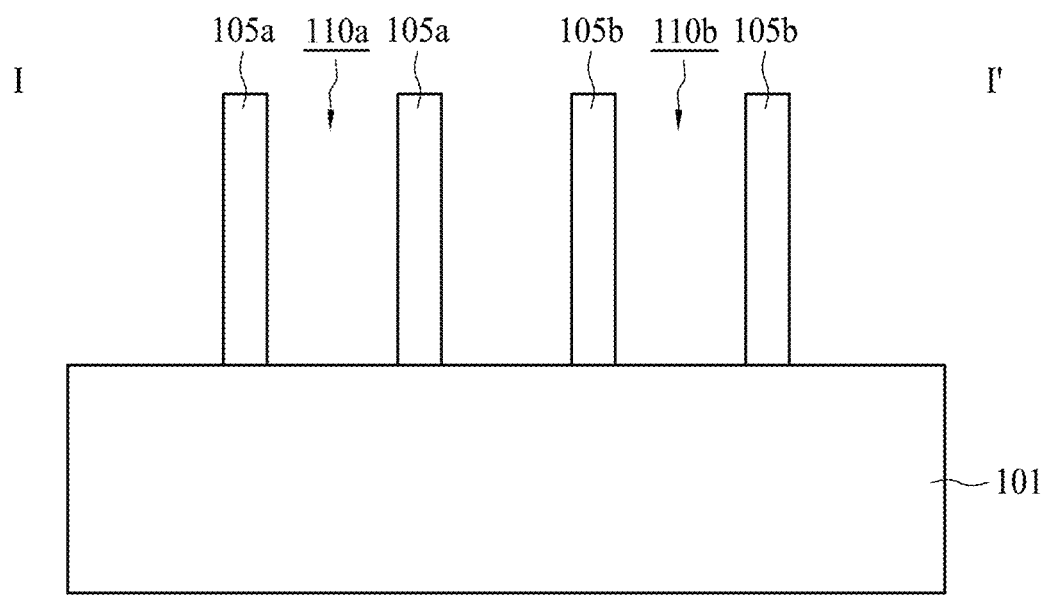
FIG. 7 is a cross-sectional view illustrating an intermediate stage of forming a semiconductor device structure, taken along a sectional line I-I' in FIG. 6, in accordance with some embodiments.

FIG. 6 is a top view illustrating an intermediate stage of forming the semiconductor device structure 100 in FIGS. 12 and 13, in accordance with some embodiments. FIG. 7 is a cross-sectional view illustrating an intermediate stage of forming the semiconductor device structure 100, taken along a sectional line I-I' in FIG. 6, in accordance with some embodiments.

As shown in FIGS. 6 and 7, the pillars 103a and 103b are removed to form openings 110a and 110b. In some embodiments, the pillar 103a is removed to form the opening 110a, such that the opening 110a is entirely surrounded by the first ring structure 105a, and the pillar 103b is removed to form the opening 110b, such that the opening 110b is entirely surrounded by the first ring structure 105b. In some embodiments, the top surface of the substrate 101 is exposed by the openings 110a and 110b.

In some embodiments, the pillars 103a and 103b are removed by an etching process, such as a dry etching process. As described above, the materials of the pillars 103a and 103b are different from the materials of the first ring structures 105a and 105b, and the materials of the pillars 103a, 103b and the first ring structures 105a, 105b are selected such that the etching selectivity of the pillars 103a and 103b with respect to the first ring structures 105a and 105b is high. Therefore, the pillars 103a and 103b are removed by the etching process while the first ring structures 105a and 105b may be substantially left in place, and the openings 110a and 110b are obtained.

Figure 8:
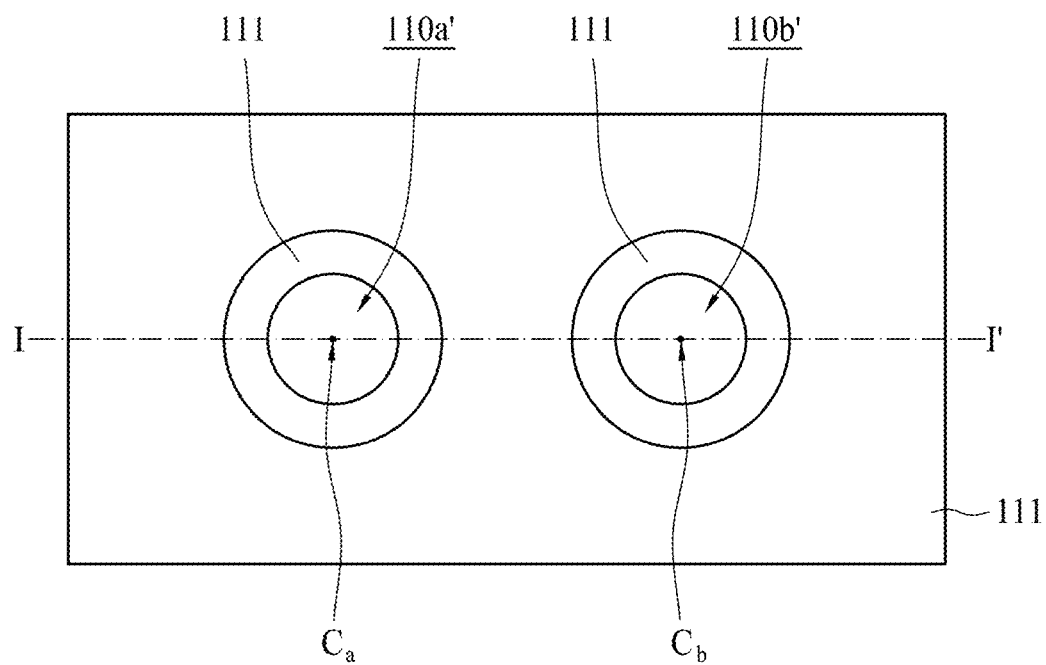
FIG. 8 is a top view illustrating an intermediate stage of forming a semiconductor device structure, in accordance with some embodiments.
Figure 9:
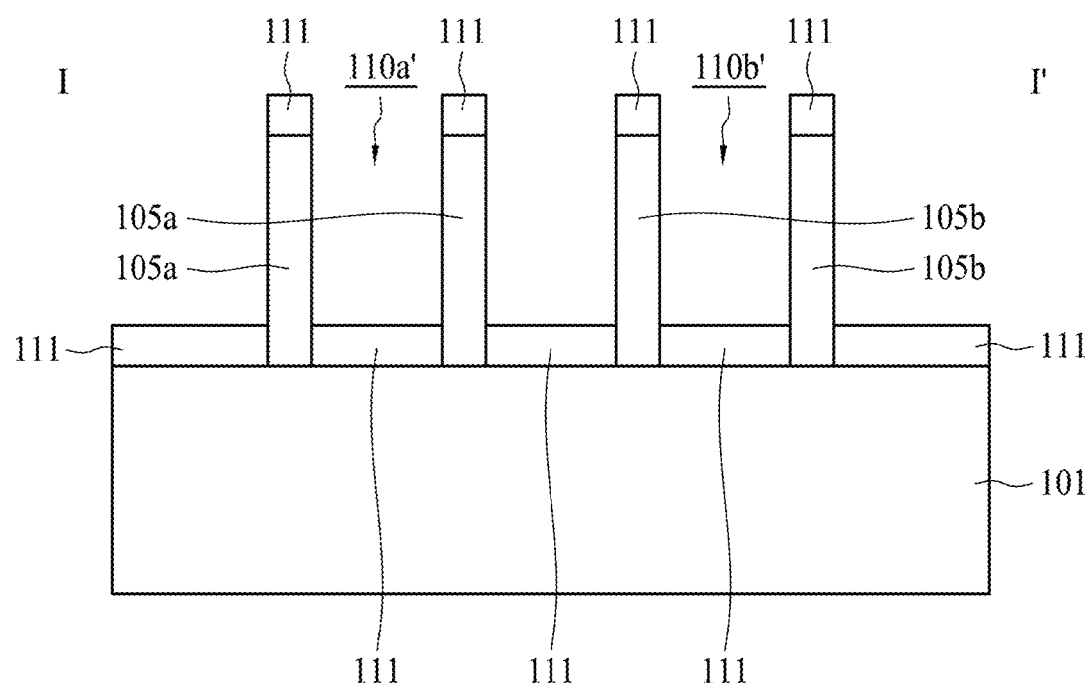
FIG. 9 is a cross-sectional view illustrating an intermediate stage of forming a semiconductor device structure, taken along a sectional line I-I' in FIG. 8, in accordance with some embodiments.

FIG. 8 is a top view illustrating an intermediate stage of forming the semiconductor device structure 100 in FIGS. 12 and 13, in accordance with some embodiments. FIG. 9 is a cross-sectional view illustrating an intermediate stage of forming the semiconductor device structure 100, taken along a sectional line I-I' in FIG. 8, in accordance with some embodiments.

As shown in FIGS. 8 and 9, a dielectric layer 111 is formed over the top surfaces of the first ring structures 105a and 105b, and over the top surface of the substrate 101. More specifically, the bottom surfaces of the openings 110a and 110b are covered by the dielectric layer 111, such that reduced openings 110a' and 110b' are formed.

Some materials and processes used to form the dielectric layer 111 are similar to, or the same as, those used to form the pillars 103a and 103b and are not repeated herein. In some embodiments, the materials of the dielectric layer 111 are different from the materials of the first ring structures 105a and 105b. In some embodiments, the dielectric layer 11 is formed by selectively growing or depositing a dielectric material over the top surfaces of the first ring structures 105a and 105b, and over the top surface of the substrate 101, leaving sidewalls of the first ring structures 105a and 105b partially exposed. That is, a portion of the sidewalls of the first ring structures 105a and 105b are not covered by the dielectric layer 111. In some embodiments, the dielectric layer 111 is formed by an epitaxial (epi) process.

Figure 10:
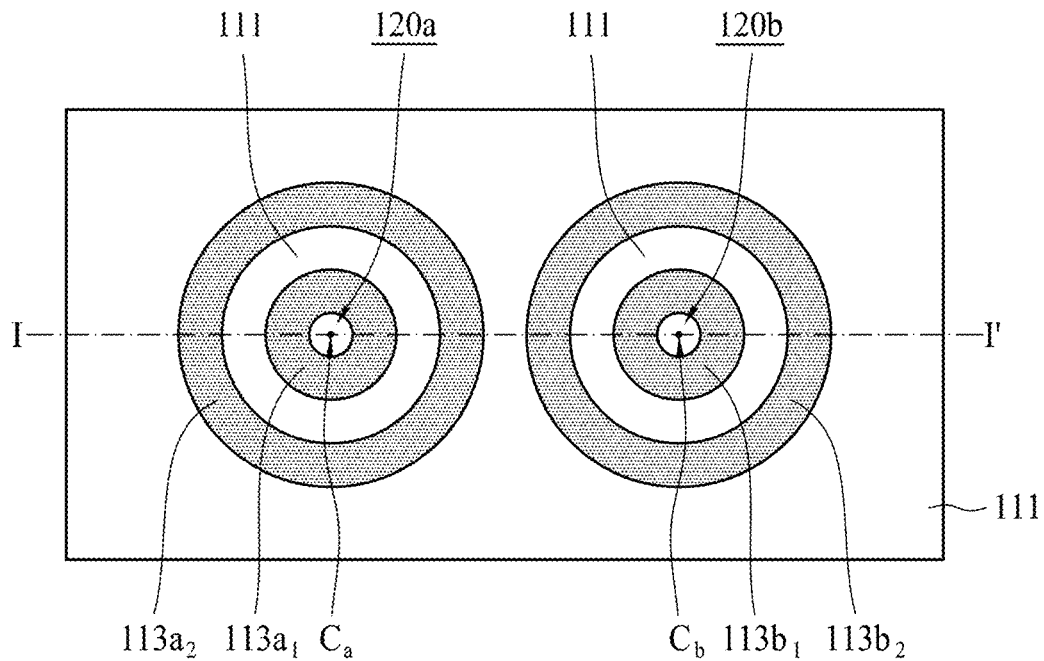
FIG. 10 is a top view illustrating an intermediate stage of forming a semiconductor device structure, in accordance with some embodiments.
Figure 11:
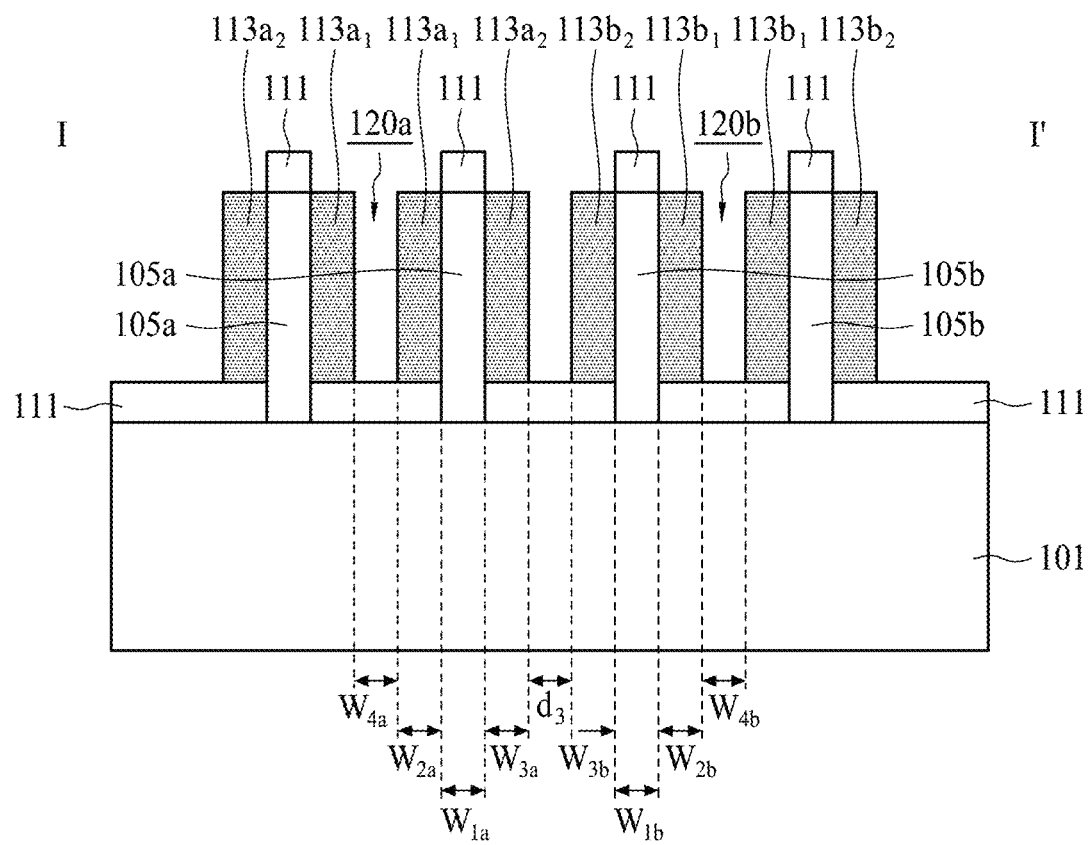
FIG. 11 is a cross-sectional view illustrating an intermediate stage of forming a semiconductor device structure, taken along a sectional line I-I' in FIG. 10, in accordance with some embodiments.

FIG. 10 is a top view illustrating an intermediate stage of forming the semiconductor device structure 100 in FIGS. 12 and 13, in accordance with some embodiments. FIG. 11 is a cross-sectional view illustrating an intermediate stage of forming the semiconductor device structure 100, taken along a sectional line I-I' in FIG. 10, in accordance with some embodiments.

As shown in FIGS. 10 and 11, second ring structures 113a and $113b_1$ are formed over inner sidewalls of the first ring structures 105a and 105b, and third ring structures $113a_2$ and $113b_2$ are formed over outer sidewalls of the first ring structures 105a and 105b. In some embodiments, the first ring structure 105a is sandwiched between and in direct contact with the second ring structure $113a_1$ and the third ring structure $113a_2$, and the first ring structure 105b is sandwiched between and in direct contact with the second ring structure $113b_1$ and the third ring structure $113b_2$.

Moreover, the reduced openings 110a' and 110b' are not entirely filled by the second ring structures 113a and 113b, resulting in the formation of openings 120a and 120b. In particular, the top surface of the dielectric layer 111 is partially exposed by the openings 120a and 120b. Specifically, the opening 120a is surrounded by the second ring structure $113a_1$, and the opening 120b is surrounded by the second ring structure $113b_1$. The top surface of the dielectric layer 111 over each of the first ring structures 105a and 105b is higher than the top surfaces of the second ring structures $113a_1$, $113b_1$, and higher than the top surfaces of the third ring structures $113a_2$ and $113b_2$.

Some materials and processes used to form the second ring structures 113a, and 113b, and the third ring structures 113a2 and $113b_2$ are similar to, or the same as, those used to form the pillars 103a and 103b and are not repeated herein. However, it should be noted that the materials of the second ring structures 113a, and 113b, and the third ring structures $113a_2$ and $113b_2$ are different from the materials of the dielectric layer 111 and the materials of the first ring structures 105a and 105b, in accordance with some embodiments.

In some embodiments, the second ring structures $113a_1$, $113b_1$ and the third ring structures $113a_2$, $113b_2$ are formed during the same process step. In some embodiments, the second ring structures 113a, 113b, and the third ring structures $113a_2$, $113b_2$ are simultaneously formed, and are made of the same material.

Moreover, the second ring structure 113a, has a width $W_{2a}$, the second ring structure $113b_1$ has a width $W_{2b}$, the third ring structure $113a_2$ has a width $W_{3a}$, the third ring structure $113b_2$ has a width $W_{3b}$, the opening 120a has a width $W_{4a}$, the opening 120b has a width $W_{4b}$, and the third ring structure $113a_2$ and the third ring structure $113b_2$ are separated by a distance $d_3$, as shown in FIG. 11 in accordance with some embodiments. In some embodiments, the widths $W_{1a}$, $W_{1b}$, $W_{2a}$, $W_{2b}$, $W_{3a}$, $W_{3b}$, $W_{4a}$, $W_{4b}$, and the distance $d_3$ are substantially the same.

FIG. 12 is a top view illustrating the semiconductor device structure 100, in accordance with some embodiments. FIG. 13 is a cross-sectional view illustrating the semiconductor device structure 100, taken along a sectional line I-I' in FIG. 12, in accordance with some embodiments.

As shown in FIGS. 12 and 13, the first ring structures 105a and 105b, and a portion of the dielectric layer 111 are removed. In particular, a portion of the dielectric layer 111 not covered by the second ring structures 113$a_1$, 113$b_1$ or the third ring structures 113$a_2$, 113$b_2$ is removed.

More specifically, a portion of the dielectric layer 111 over the top surface of the first ring structures 105a and 105b, and a portion of the dielectric layer 111 over the top surface of the substrate 101 and not covered by the second ring structures 113$a_1$, 113$b_1$ or the third ring structures 113$a_2$, 113$b_2$ are removed by an etching process. In some embodiments, the etching process is performed by using the second ring structures 113$a_1$, 113$b_1$ and the third ring structures 113$a_2$, 113$b_2$ as a mask. The etching process includes a dry etching process, a wet etching process, or a combination thereof, in accordance with some embodiments.

As described above, the materials of the second ring structures 113a, and 113$b_1$ and the third ring structures 113$a_2$ and 113$b_2$ are different from the materials of the dielectric layer 111 and the materials of the first ring structures 105a and 105b, and the materials of the first ring structures 105a, 105b, the dielectric layer 111, the second ring structures 113$a_1$, 113$b_1$, and the third ring structures 113$a_2$, 113$b_2$ are selected such that the etching selectivities of the dielectric layer 111 and the first ring structures 105a, 105b with respect to the second ring structures 113$a_1$, 113$b_1$, and the third ring structures 113$a_2$, 113$b_2$ are high. Therefore, the first ring structures 105a, 105b and a portion of the dielectric layer 111 are removed by the etching process while the second ring structures 113$a_1$, 113$b_1$ and the third ring structures 113$a_2$, 113$b_2$ may be substantially left intact.

When the dielectric layer 111 is partially removed, the openings 120a and 120b are deepened such that openings 120a' and 120b' are obtained. In some embodiments, the opening 120a' is entirely surrounded by the second ring structure 113$a_1$, and the opening 120b' is entirely surrounded by the second ring structure 113$b_1$. Moreover, a gap 130a is formed between the second ring structure 113a, and the third ring structure 113$a_2$, and a gap 130b is formed between the second ring structure 113$b_1$, and the third ring structure 113$b_2$. In addition, the top surface of the substrate 101 is partially exposed by the gaps 130a, 130b and the openings 120a', 120b', in accordance with some embodiments.

In some embodiments, the width $W_{4a}$ of the openings 120a', the width $W_{2a}$ of the second ring structure 113$a_1$, the width $W_{1a}$ of the gap 130a, the width $W_{3a}$ of the third ring structure 113$a_2$, the distance $d_3$ between the third ring structures 113$a_2$ and 113$b_2$, the width $W_{3b}$ of the third ring structure 113$b_2$, the width $W_{1b}$ of the gap 130b, the width $W_{2b}$ of the second ring structure 113$b_1$, and the width $W_{4b}$ of the openings 120b' are substantially the same. As a result, the semiconductor device structure 100 is obtained with two concentric double ring structures (i.e., the center $C_a$ is the common center of the second ring structure 113$a_1$ and the third ring structure 113$a_2$, and the center $C_b$ is the common center of the second ring structure 113$b_1$ and the third ring structure 113$b_2$) in the top view of FIG. 12.

It should be noted that, although only two concentric double ring structures are illustrated in FIG. 12, the present disclosure is not limited thereto. Depending on the product demands, the number of concentric double ring structures in the semiconductor device structure 100 may be one or more than two. Furthermore, the concentric double ring structures can have other shapes in the top view, and each of the concentric ring structures can have more than two rings, such as concentric triple ring structures.

Embodiments of a semiconductor device structure and a method for forming the same are provided. The method for forming the semiconductor device structure 100 includes forming the pillars 103a, 103b over the substrate 101, and the pillars 130a, 103b are separated by a distance $d_1$. The method also includes forming the first ring structures 105a, 105b surrounding the pillars 103a, 103b, removing the pillars 103a, 103b, forming the second ring structures 113$a_1$, 113$b_1$ over the inner sidewalls of the first ring structures 105a, 105b, and forming the third ring structures 113$a_2$, 113$b_2$ over the outer sidewalls of the first ring structures 105a, 105b. The method further includes removing the first ring structures 105a, 105b to form gaps 130a, 130b between the second ring structures 113$a_1$, 113$b_1$ and the third ring structures 113$a_2$, 113$b_2$.

The widths $W_{1a}$, $W_{1b}$ of the gaps 130a, 130b, the widths $W_{4a}$, $W_{4b}$ of the openings 120a', 120b' surrounded by the second ring structures 113$a_1$, 113$b_1$, and the distance $d_3$ between the third ring structures 113$a_2$, 113$b_2$ are substantially the same, and are smaller than the distance $d_1$ between the pillars 103a, 103b. The widths $W_{2a}$, $W_{2b}$ of the second ring structures 113$a_1$, 113$b_1$, and the widths $W_{3a}$, $W_{3b}$ of the third ring structures 113$a_2$, 113$b_2$ are substantially the same, and are smaller than the widths $W_a$, $W_b$ of the pillars 103a, 103b. Therefore, the semiconductor device structure 100 having a finer pattern (with reduced pitch of patterns compared to the pattern of the pillars 103a, 103b) can be obtained.

Moreover, since a finer pattern with relatively smaller critical dimension can be obtained by the aforementioned method for forming the semiconductor device structure 100, the limitation in the resolution of the exposure apparatus can be overcome, and semiconductor fabrication may be achieved without requiring the use of high-priced semiconductor fabrication equipment.

Figure 14:
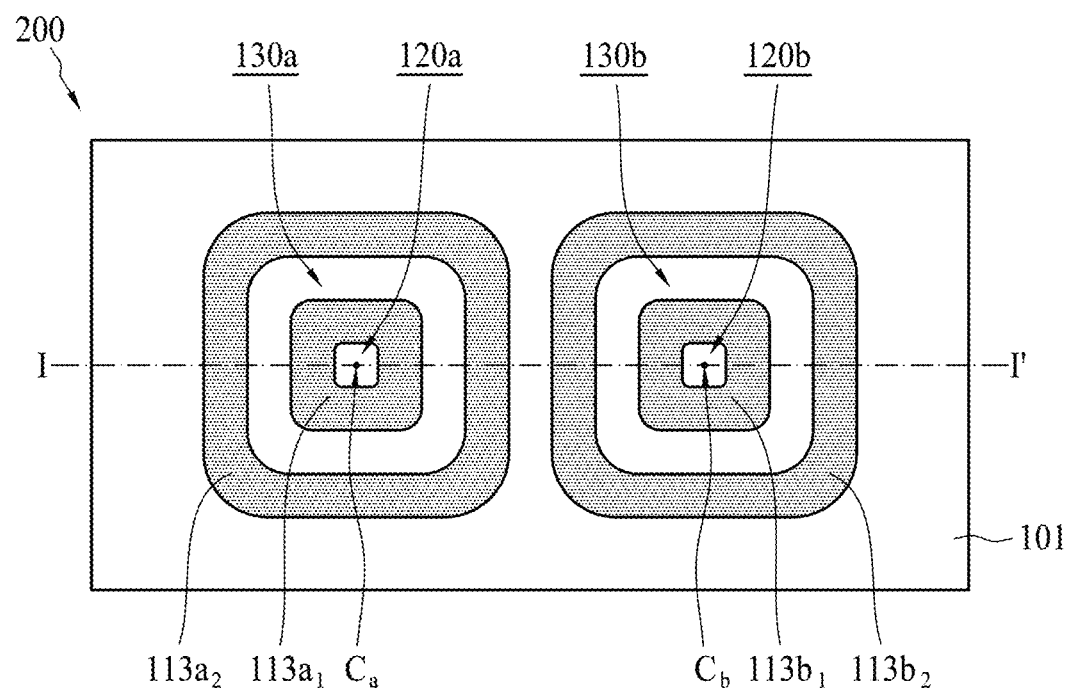
FIG. 14 is a top view illustrating a semiconductor device structure, in accordance with some embodiments.

FIG. 14 is a top view illustrating a semiconductor device structure 200, in accordance with some embodiments.

In some embodiments, the two concentric double ring structures can be rectangles with rounded corners in the top view. In particular, the two concentric double ring structures can be squares with rounded corners in the top view, as shown in FIG. 14 in accordance with some embodiments. In these cases, the second ring structure 113$a_1$ and the third ring structure 113$a_2$ have point symmetry about the center $C_a$, and the second ring structure 113$b_1$ and the third ring structure 113$b_2$ have point symmetry about the center $C_b$. In addition, FIG. 13 is taken along a sectional line I-I' in FIG. 14, in accordance with some embodiments, and the sectional line I-I' passes through the centers $C_a$ and $C_b$.

In one embodiment of the present disclosure, a method for forming a semiconductor device structure is provided. The method includes forming a pillar over a substrate, and forming a first ring structure over a sidewall of the pillar. The method also includes removing the pillar to form a first opening surrounded by the first ring structure, and forming a second ring structure in the first opening. The method further includes forming a third ring structure surrounding the first ring structure after the first opening is formed, and removing the first ring structure to form a gap between the second ring structure and the third ring structure.

In another embodiment of the present disclosure, a method for forming a semiconductor device structure is provided. The method includes forming a first pillar over a substrate, and forming a first ring structure surrounding the first pillar. A width of the first pillar is greater than a width of the first ring structure. The method also includes removing the first pillar after the first ring structure is formed, and forming a dielectric layer over a top surface of the substrate after the first pillar is removed. The method further includes forming a second ring structure and a third ring structure over the dielectric layer. The second ring structure is surrounded by the first ring structure, and the second ring structure is surrounded by the third ring structure. In addition, the method includes removing the first ring structure and a portion of the dielectric layer not covered by the second ring structure or the third ring structure.

In one embodiment of the present disclosure, a semiconductor device structure is provided. The semiconductor device structure includes a substrate, and a dielectric layer disposed over the substrate. The semiconductor device structure also includes a first ring structure disposed over the dielectric layer, and a second ring structure disposed over the dielectric layer and surrounding the first ring structure. The first ring structure and the second ring structure have a first common center. The first opening surrounded by the first ring structure has a width in a cross-sectional view, and the width is substantially the same as a distance between the first ring structure and the second ring structure in the cross-sectional view.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for forming a semiconductor device structure, comprising:
    forming a pillar over a substrate;
    forming a first ring structure over a sidewall of the pillar;
    removing the pillar to form a first opening surrounded by the first ring structure;
    forming a dielectric layer over a top surface of the substrate and a top surface of the first ring structure;
    forming a second ring structure in the first opening;
    forming a third ring structure surrounding the first ring structure after the first opening is formed; and
    removing the first ring structure to form a gap between the second ring structure and the third ring structure;
    wherein a top surface of the dielectric layer is higher than top surfaces of the second ring structure and the third ring structure before the first ring structure is removed.

2. The method for forming a semiconductor device structure of claim 1, wherein the first ring structure is in direct contact with the second ring structure, and a width of the first ring structure is substantially the same as a width of the second ring structure.

3. The method for forming a semiconductor device structure of claim 1, wherein the first ring structure is in direct contact with the third ring structure, the second ring structure and the third ring structure are simultaneously formed, and a width of the second ring structure is substantially the same as a width of the third ring structure.

4. The method for forming a semiconductor device structure of claim 1, wherein a width of the pillar is greater than about three times a width of the first ring structure.

5. The method for forming a semiconductor device structure of claim 1, wherein the second ring structure and the third ring structure are formed over the dielectric layer, and a material of the dielectric layer is different from a material of the second ring structure and a material of the third ring structure.

6. The method for forming a semiconductor device structure of claim 1, wherein a second opening is formed in the first opening after the second ring structure is formed, the second opening is surrounded by the second ring structure, and a width of the first ring structure is substantially the same as a width of the second opening.

7. A method for forming a semiconductor device structure, comprising:
    forming a first pillar over a substrate;
    forming a first ring structure surrounding the first pillar, wherein a width of the first pillar is greater than a width of the first ring structure;
    removing the first pillar after the first ring structure is formed;
    forming a dielectric layer over a top surface of the substrate after the first pillar is removed;
    forming a second ring structure and a third ring structure over the dielectric layer, wherein the second ring structure is surrounded by the first ring structure, and the second ring structure is surrounded by the third ring structure; and
    removing the first ring structure and a portion of the dielectric layer left uncovered by the second ring structure and the third ring structure.

8. The method for forming a semiconductor device structure of claim 7, wherein a portion of the dielectric layer is formed over the first ring structure, and a top surface of the portion of the dielectric layer is higher than a top surface of the second ring structure and a top surface of the third ring structure.

9. The method for forming a semiconductor device structure of claim 7, wherein the second ring structure is in direct contact with an inner sidewall of the first ring structure, and the third ring structure is in direct contact with an outer sidewall of the first ring structure.

10. The method for forming a semiconductor device structure of claim 7, wherein the second ring structure and the third ring structure are separated by substantially the same distance.

11. The method for forming a semiconductor device structure of claim 7, wherein bottom surfaces of the second ring structure and the third ring structure are higher than a bottom surface of the first ring structure.

12. The method for forming a semiconductor device structure of claim 7, further comprising:
    forming a second pillar over the substrate;
    forming a fourth ring structure surrounding the second pillar;
    removing the second pillar; and
    forming a fifth ring structure lining an inner wall of the fourth ring structure and a sixth ring structure surrounding the fourth ring structure, wherein a distance between the third ring structure and the sixth ring structure is substantially the same as a width of the first ring structure and a width of the third ring structure.

\* \* \* \* \*